(12) United States Patent
Petersen et al.

(10) Patent No.: US 6,204,189 B1
(45) Date of Patent: Mar. 20, 2001

(54) FABRICATION OF PRECISION HIGH QUALITY FACETS ON MOLECULAR BEAM EPITAXY MATERIAL

(75) Inventors: Holly E. Petersen, Tracy; William D. Goward, Antioch; Sol P. Dijaili, Moraga, all of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/239,631

(22) Filed: Jan. 29, 1999

(51) Int. Cl.$^7$ ................................................ H01L 21/302
(52) U.S. Cl. .............................................. 438/706; 216/42
(58) Field of Search .................................. 438/706, 712, 438/714, 604, 605, 607, 606; 156/643, 651, 662; 216/42, 47, 48

(56) References Cited

U.S. PATENT DOCUMENTS

| | | | |
|---|---|---|---|
| 4,285,763 | * 8/1981 | Coldren et al. | 438/712 |
| 4,797,890 | * 1/1989 | Inaba et al. | 372/46 |
| 5,032,219 | 7/1991 | Buchmann et al. | 156/643 |
| 5,034,344 | 7/1991 | Jewell et al. | 437/129 |
| 5,103,493 | 4/1992 | Buchmann et al. | 385/14 |
| 5,104,824 | 4/1992 | Clausen, Jr. et al. | 437/90 |
| 5,693,963 | * 12/1997 | Fujimoto et al. | 257/94 |
| 5,747,842 | 5/1998 | Plumton | 257/266 |
| 5,753,940 | * 5/1998 | Komoto et al. | 257/95 |
| 5,789,265 | * 8/1998 | Nitta et al. | 438/22 |
| 5,833,749 | 11/1998 | Moritani et al. | 117/101 |
| 5,835,521 | 11/1998 | Ramdani et al. | 372/96 |
| 5,837,561 | 11/1998 | Kish, Jr. et al. | 438/47 |

OTHER PUBLICATIONS

G. A. Lincoln et al, "Large area ion beam assisted etching of GaAs with high etch rates and controlled anisotropy," Journal of Vacuum Science and Technology, B14, pp 1043–1046, Oct.–Dec. 1983.

A. Scherer et al, "Fabrication of microlasers and microresonator optical switches," Appl. Phys. Lett. 55 (26), pp 2724–2726, Dec. 25, 1989.

M. Jost et al, "Ridge Formation for AlGaAs GRINSCH Lasers by $Cl_2$ Reactive Ion Etching," IEEE Photonics Technology Letters, vol. 2. No. 10, pp 697–698, Oct. 10, 1990.

Peter Vettiger et al, "Full–Wafer Technology-A New Approach to Large–Scale Laser Fabrication and Integration," IEEE Journal of Quantum Electronics, vol. 27, No. 6, pp 1319–1331, Jun. 1991.

* cited by examiner

Primary Examiner—Benjamin L. Utech
Assistant Examiner—Duy-Vu Deo
(74) Attorney, Agent, or Firm—Alan H. Thompson

(57) ABSTRACT

Fabricating mirrored vertical surfaces on semiconductor layered material grown by molecular beam epitaxy (MBE). Low energy chemically assisted ion beam etching (CAIBE) is employed to prepare mirrored vertical surfaces on MBE-grown III-V materials under unusually low concentrations of oxygen in evacuated etching atmospheres of chlorine and xenon ion beams. UV-stabilized smooth-surfaced photoresist materials contribute to highly vertical, high quality mirrored surfaces during the etching.

29 Claims, 3 Drawing Sheets his inven-

FABRICATION OF PRECISION HIGH QUALITY FACETS ON MOLECULAR BEAM EPITAXY MATERIAL

The United States Government has rights in this invention pursuant to Contract No. W-7405-ENG-48 between the United States Department of Energy and the University of California for the operation of Lawrence Livermore National Laboratory.

FIELD OF THE INVENTION

The present invention relates to fabrication of etched facets on semiconductor materials.

BACKGROUND OF THE INVENTION

Devices such as specialized semiconductor optical amplifiers require mirror quality sidewalls, and the success of these devices is strongly dependent on reflectivity of the mirror surface. With the combination of optimized mirror design and crystal growth, and the use of anisotropic ion etching, micron-sized optical microresonators have been fabricated. These capabilities are now also applied to electrically and optically pumped surface-emitting microlasers and other vertical-cavity devices. In order to define the deep structures needed for these applications, highly anisotropic and nonselective ion etching processes must be optimized. Furthermore, improved masking techniques must be devised to produce low-resistance contacts for electrically pumped structures. Chemically assisted ion beam etching (CAIBE), a technique in which the sample is simultaneously subjected to both an ion beam and a reactive gas flux, has been demonstrated to be an extremely anisotropic pattern transfer method. The capabilities of this technique are ideal for solving the problems associated with microfabrication of semiconductor devices, such as vertical-emitting semiconductor lasers, and has already replaced cleaving techniques for making high quality mirror finish sidewalls. For III-V materials, facets can be cleaved in two orthogonal directions along preferred crystal directions. Whereas CAIBE etching can be done anywhere and practically any shape structure can be made including mesas, ridges and wells.

However, new or modified fabrication techniques which are used to produce optically and electrically pumped laser and microresonator arrays are still being sought. A technique known as dry etching can make smooth mirror quality etched surfaces, as well as depth and verticality requirements to semiconductor devices.

SUMMARY OF THE INVENTION

The invention provides a CAIBE method for controlling the verticality of mirrored sidewalls in semiconductor-containing devices by etching the sidewalls of a substrate such as a molecular beam epitaxy (MBE) material. The method correlates such factors as beam collimation and beam energy, the reactive gas (e.g., chlorine) flux at the substrate, the elimination of oxygen-containing species present in a vacuum system and the quality of the masking edge produced during photolithography to provide a quality etch to the surface of the device. The chlorine flux and the ion beam, working in tandem, etch a high quality vertical facet. The mask material can be a positive photoresist and the mask to substrate etch selectivity is above about 15 to 1. Such etch selectivities allow vertical sidewalls of high mirror quality that are at least 5 microns in height.

In a preferred embodiment, a high resolution for vertical sidewalls is achieved by applying optics above UV300 (e.g. UV400 at 20 mW/cm$^3$) with a positive photoresist (e.g., AZ 5214-E resist) of thickness from about 1.0 to 1.2 microns in an allowable oxygen-containing atmosphere (e.g., water) of less than about $1 \times 10^{-10}$ Torr. Thermal stability is maintained with a hard bake temperature at least as high or higher than that experienced by the substrate during CAIBE. A chlorine flow is preferred at about 8 to about 14 sccm (e.g., 10 sccm) with two or more chlorine gas jets being employed. Etching is accomplished at a suitable rate with an etch beam energy preferably less than about 500 eV. The finished mirrored vertical surface of the substrate is within about +or −5% from vertical and has a roughness of less than 10 nm, calculated as mean square roughness (Rms) determined by an atomic force microscopic measurement in a field view area of 10 micron×10 micron.

DETAILED DESCRIPTION OF THE INVENTION

Figure 1:
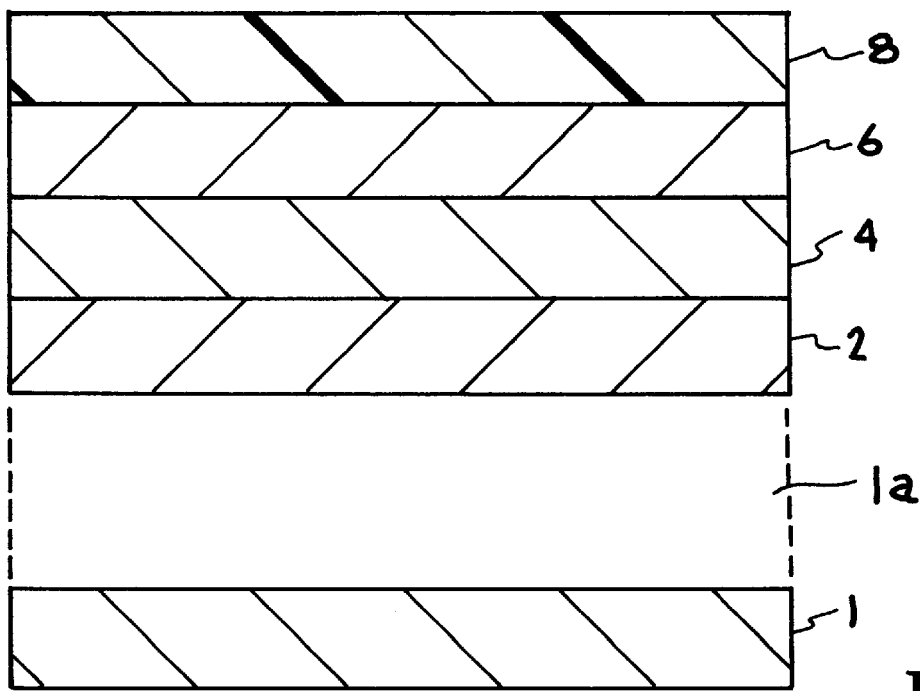
FIG. 1 illustrates a side view of a photoresist mask covering an semiconductor-layered substrate.

The method of the present invention is effective during the fabrication of semiconductor-containing materials having etched facets in such devices as edge-emitting lasers, semiconductor optical amplifiers and vertical cavity emitting lasers and amplifiers. Preferred devices include channel dropping filters, wavelength division multiplexers, turning mirrors, and splitters. A more preferred use of such etch-faceted semiconductor materials is in photonic integrated circuits where active devices such as edge emitting lasers and semiconductor optical amplifiers are coupled to passive waveguides via etched facets.

The fabrication of smooth sidewall surfaces of the vertical faceted semiconductor-containing materials such as MBE grown materials, (e.g., laser mirror facets in edge-emitting optical devices), involves multiple steps. In general, substrates treated by the invention contain at least a layer of a first material and an adjacent layer of a second material. Usually Group III and Group V elements in combination (i.e., III-V materials) encompass layers of the substrate materials treated by the method of the invention. The III-V material usually encompasses one or more Group III elements selected from the group consisting of In, Al and Ga and one or more Group V elements selected from the group consisting of Sb, P, N and As. Substrate materials containing GaAs and AlGaAs are highly preferred.

Usually the substrate material is initially cleaned to remove particulate material, e.g., the native oxides, for the purpose of promoting adhesion of masking materials. Various cleaning agents may be employed such as deionized water, dilute acids and bases, and the like.

The cleaned materials are masked to transfer a pattern to the MBE substrate materials. Masking of the layered semiconductor-containing substrate materials to produce a predetermined pattern on the substrate may be achieved with several types of masks, including a metal-containing patterned mask or a preferred polymer-containing photoresist, particularly with a mask aligner that allows ultraviolet light through it. In conventional etching processes, ion beam etching may remove too much photoresist if the etch selectivity is too low to make vertically etched cuts of at least 5 micron on a body containing multilayers of semiconductor materials. Although any known mask may be applied in the method of the invention, it is preferred to deposit a polymer-containing photoresist to the substrate. The photoresist is preferably spread over the top surface while spun at high revolutions per minute (RPMs) to form a smooth, uniform film, whose thickness depends upon the viscosity of the photoresist and the spin speed. Furthermore, it has been found that the photoresist employed herein can be defined as a mask on the surface of the substrate at relative humidities greater than 50%. Usually the thickness of the photoresist is about 0.8 to 1.4 micron, and preferably about 1.0 to 1.2 micron. Exemplary photoresists are capable of producing a coating thickness of greater than 1.1, and preferably greater than 1.3 microns at 4000 rpm spin.

The photoresist is then oven cured, normally at about 75 to about 100 degrees C., and typically about 85 to 95 degrees C. FIG. 1 illustrates a mask covering a top surface of a semiconductor-containing substrate material (such as MBE) having layer 1, additional layers 1A and further showing three layers of semiconductor material—a gallium arsenide-containing layer 2 covered with an aluminum gallium arsenide-containing layer 4 covered with a top gallium arsenide-containing layer 6 covered with the photoresist mask 8.

Figure 2:
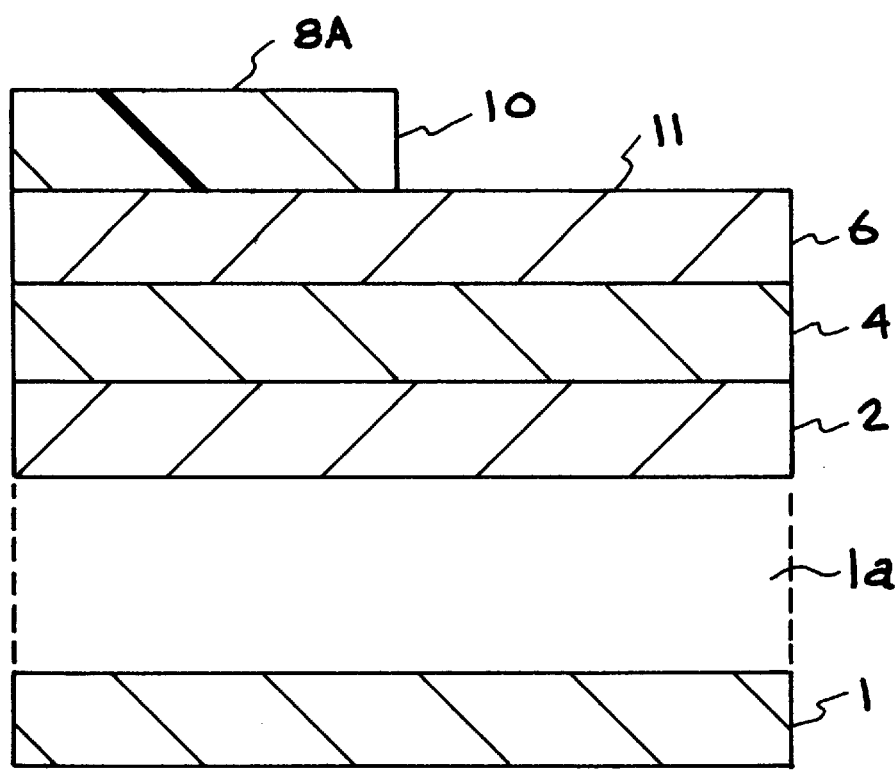
FIG. 2 illustrates a side view of a removed portion from the photoresist mask on the substrate of FIG. 1.

The oven-cured photoresist is exposed to ultraviolet light in areas of openings in a mask, thereby transferring a mask pattern to the substrate materials. The UV-exposed photoresist area of the pattern is typically developed with developing solution or other means so as to be removed, thereby leaving the pattern. The substrate is typically rinsed of developing solution and dried. FIG. 2 illustrates the semiconductor-containing layers 1, 1A, 2, 4 and 6 of FIG. 1 and a remaining area 8A of the photoresist 8 (of FIG. 1) that includes a remaining smooth sidewall 10 of the photoresist and an exposed opening surface 11 of the substrate (portion of top of layer 6) that comprises a portion of the pattern transferred from the mask onto the substrate.

The remaining UV-exposed photoresist on the semiconductor layers is preferably stabilized by deep ultraviolet light exposure at wavelengths greater than 300 nm, and most preferably above about 410 nm and then hard baked at above 100 degrees, and preferably above about 120 degrees C. The hard baked photoresist-covered semiconductor-layered substrate having its desired pattern is placed in an etching chamber usually in a load lock.

Although any known vacuum etching chamber effective for the CAIBE method can be utilized in the invention, a preferred apparatus and system for use herein is disclosed in U.S. Pat. No. 5,034,344, issued to Jewell et al., particularly in FIG. 9 and cols. 6 and 7, the disclosure of which is incorporated by reference herein in its entirety. The elements of such an apparatus include the chamber, a load lock, a reactive gas (such as a halogen gas, e.g., $Cl_2$, $Br_2$, HBr or $I_2$) supply, an ion source (e.g., Kaufmann ion source), an inert gas supply, a mass flow controller (MFC), a quadrapole mass spectrometer, a pumping stack and chamber. After loading and locking the prepared substrate into a main etching chamber, a critical feature of the invention involves evacuating the chamber down to an oxygen-containing atmosphere less than $10^{-9}$ Torr, preferably less than $10^{-10}$ Torr, and most preferably less than $10^{-11}$ Torr (usually calculated as the partial pressure of water). Although a base pressure of about $10^{-7}$ Torr in the chamber is conventional, a partial pressure of oxygen-containing species lower than about $10^{-10}$ Torr in the etching atmosphere provide surprisingly improved roughness and verticality results on sidewall surfaces for mirrored vertical facets on semiconductor-containing devices.

In the CAIBE etching method, a substrate such as that represented in FIG. 2 is water cooled and shuttered from the ion beam and, in a preferred case, chlorine gas. Normally the ion beam is derived from an inert gas such as argon, xenon or krypton. A meissner liquid nitrogen cold trap can be cooled down to condense any unused chlorine and reaction products. In a preferred case, xenon gas is introduced to the back of a gun chamber through an MFC from a relatively pure bottle. The chlorine is usually evaporated from a liquid source and is introduced at the substrate surface via its own MFC. The pressure chamber is regulated by the MFC's and the substrate can be rotated and tilted at any angle with respect to the incident ion beam from normal incidence to 45 degrees, depending on the desired etch profile.

The ion gun has an electron emitter (cathode), a nobel gas inlet, an anode and two collimating grids. Neutralizer filaments are in line of the beam path. A combination shutter/ion probe for shielding the substrate during ion gun start up and for measuring the ion current density of the beam is employed. The ion gun is turned on and set at the desired operating parameters, i.e., beam voltage and current, magnet current, extractor voltage and current, neutralizer voltage and current, stage bias, stage angle, and rotation, and the shutter moved out of the way to allow etching to be initiated. The etching parameters include the ion beam energy and beam settings coordinated with the operating parameters, chamber pressure and oxygen-containing species (water) partial pressures, gas flow, substrate rotation and angle of incidence of the ion beam, and proximity of chlorine delivery to the substrate. Although the ion beam energy can be relatively high such as 1000 e.V., it is a feature of the invention that surprising good results with respect to etching, verticality and/or roughness of the mirror facet surfaces are obtained when the ion beam energy is in the range from 400 to 600 e.V. and most preferably less than 500 e.V., and in some unusual cases, less than 450 e.V. or less than 400 e.V. Furthermore, the partial pressure of the oxygen-containing species (e.g., water) is monitored both before and during the etching process with a differentially pumped quadropole mass spectrometer.

Figure 3:
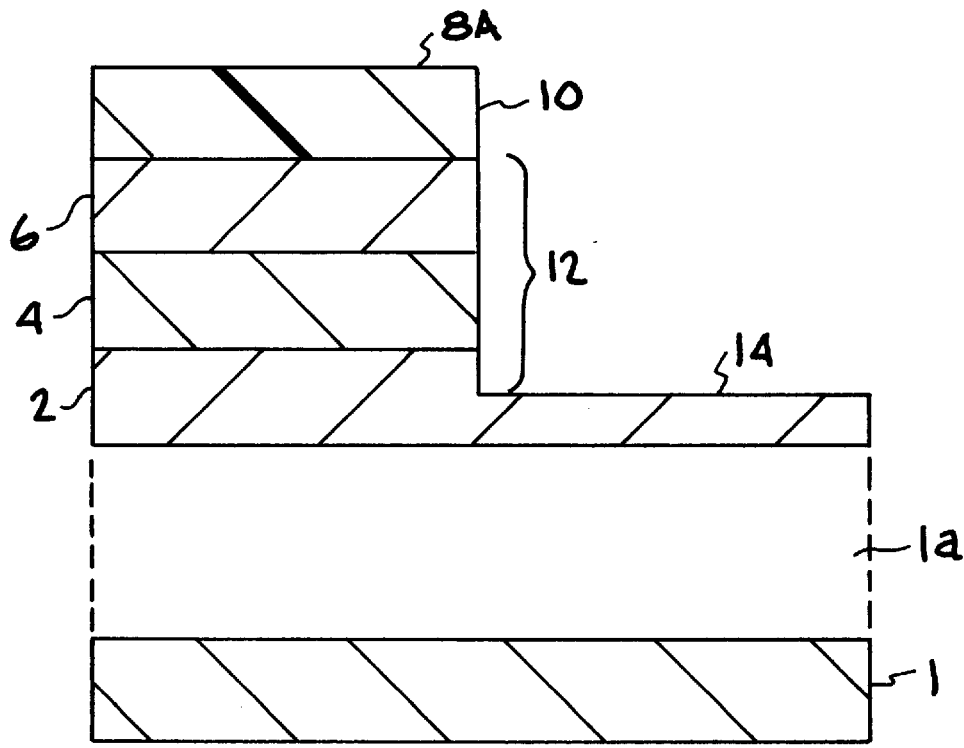
FIG. 3 illustrates a side view of a smooth, etched sidewall and bottom well of the photoresist-containing substrate.
Figure 4:
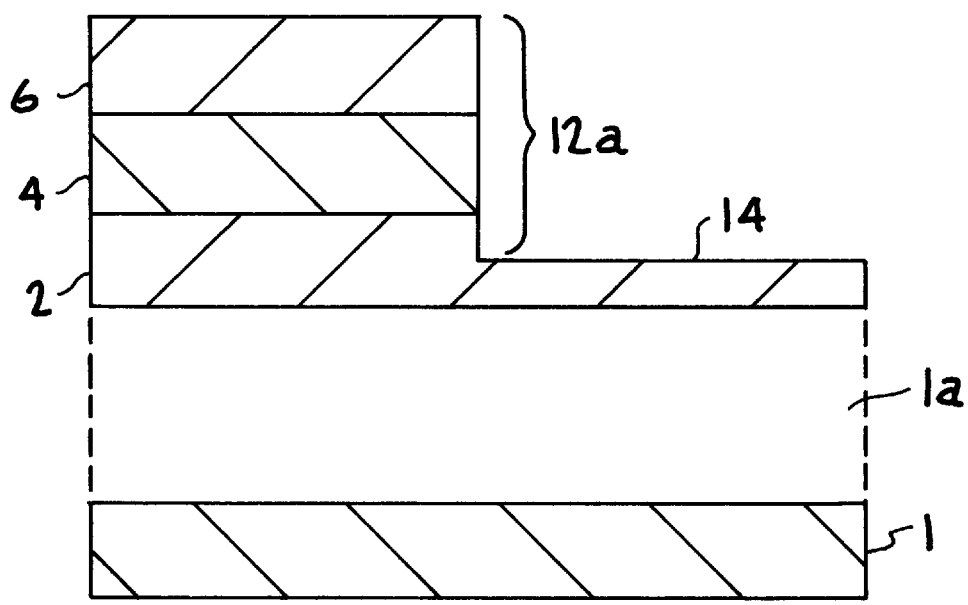
FIG. 4 illustrates a side view of the etched substrate of FIG. 3 after removal of the remaining photoresist.

During etching, normally anisotropically etching, the ion beam (e.g., xenon) impinges downward on the top of the substrate surface and the physical bombardment of such ions causes removal of the semiconductor material while the chlorine species are depositing on the semiconductor surface and being activated by the xenon ions to create a reaction forming volatile chlorides, such as gallium and arsenic, which escape the surface. In FIG. 3, the semiconductor-containing substrate, including layers 1, 1A, 2, 4 and 6 and remaining photoresist 8A of FIG. 2 is illustrated with an etched sidewall 12 extending downward on the same plane as the smooth side sidewall surface 10 of photoresist 8A. Normally the reactive gas (e.g., chlorine species) is predominantly effective at removing material from a sidewall, such as sidewall 12 in FIG. 3, while xenon ions remove material from the top surfaces of layers 6, 4 and a portion of layer 2 as shown in FIG. 3. Although the etching is not shown in FIG. 3, the result of the etching of top surface 11 of layer 6 in FIG. 2 as well as the continued etching through layer 4 and a portion of layer 2 is illustrated with a bottom surface layer 14 in layer 2 of FIG. 3. When the etching is stopped at a desired depth, usually upwards to a depth of about 5 microns, a bottom surface (such as bottom surface 14 in FIG. 3) is produced that forms an angle with the adjacent sidewall surface (i.e., sidewall surface 12) that is within about 5 degrees of 90 degrees, i.e., extremely good verticality.

A preferred example of semiconductor-containing layered material, etched in the manner of above, includes a substrate, preferably doped n or p, and +or −, covered by about a 1 micron thick doped n or p gallium arsenide buffer, covered with by about a 1 micron lower cladding of doped n or p $Al_{0.6}Ga_{0.4}As$, covered by a semiconductor layer of about a 0.200 micron thickness of parabolically graded aluminum content from 0.6 to 0.2, covered by an active layer having about an 50 angstrom $Al_{0.2}Ga_{0.8}As$/80 angstrom GaAs/50 angstrom $Al_{0.2}Ga_{0.8}As$ composite, covered by another parabolically graded aluminum content (0.6–0.2) layer, covered by about another $Al_{0.6}Ga_{0.4}As$ upper cladding layer, covered by a 0.200 micron doped p or n GaAs cap layer, covered by the photoresist. The etching depth, for instance, can be stopped in the lower cladding layer, thus exposing the active layer in the semiconductor material.

The hard baked photoresist (normally a positive photoresist), stabilized with ultraviolet light greater than 300 nm, prevents substantial etching of the semiconductor material masked by the photoresist. After photoresist development, the resulting smoothness of the sidewall surface of the hard baked photoresist contributes to the extremely low roughness values of the etched sidewall surface of the semiconductor-containing material. A roughness of the resulting etched mirrored vertical facet (12 in FIG. 3) on the substrate is normally less than 10 nanometers, and preferably less than 8 nanometers, as determined by an atomic force microscopic measurement in a field view area of 10 micron×10 micron. Such low roughness can be attributed, at least by a major part, to the roughness and stability of the sidewall of the photoresist which serves as a guide for the etching angle during the formation of the vertical sidewalls of the layers of the semiconductor-containing substrate. Although low ratios of between 8 to 1 and 15 to 1 can be utilized, the etch selectivity between layers of the substrate and the photoresist are normally greater than 15 to 1, and preferably greater than 18 to 1, and most preferably greater than 20 to 1.

After the etching is complete, the remainder of the photoresist can be removed with organic solvents such as acetone or by plasma ashing. The step height or vertical facet height can be measured using a stylus profilometer. Normally the etched material is examined in a scanning electron microscope (SEM) to assess the verticality and smoothness of the sidewalls.

The foregoing description of the embodiments of the present invention has been presented for purposes of illustration and description. It is not intended to be exhaustive or to limit the invention to the precise forms described.

EXAMPLE I

A semiconductor-containing substrate (Aluminum Gallium Arsenide Quantum Well Molecular Beam Epitaxy—MBE material) is patterned and mirrored vertical sidewalls prepared with a rugged photoresist mask using a photolithographic method designed specifically for the CAIBE etching process. A main etching vacuum chamber as described herein before is employed to etch the MBE grown material. The etchable MBE material is transferred onto a water cooled rotating stage. The vacuum vessel is cryogenically pumped and after several hours of baking using the ion beam to heat the chamber walls and internal surfaces, a base pressure of $4 \times 10^{-8}$ Torr is achieved. In separate experiments, the oxygen-containing species (mainly water) is removed down to a partial pressure of $10^{-9}$ Torr and $10^{-11}$ Torr, respectively. A differentially pumped quadrapole mass spectrometer (QMS) is attached to the system to identify residual gas species in the chamber and to verify the purity of the process gases. The QMS is in line of sight with the etching.

Chlorine is delivered to the chamber from an ultra high purity bottle through a mass flow controller (MFC). Inside the chamber the chlorine is delivered to the part through stainless steel tubing. Similarly, the noble gas (xenon) is delivered to the ion beam gun from an ultra high purity bottle via an MFC. Xenon is selected over argon for its higher milling rate and greater angle of maximum etch rate. A capacitance manometer is attached to the main chamber for measuring true pressure during etching.

The ion source is a Commonwealth Scientific Millitron VIII gun that has two pyrolytic graphite collimating grids that are between the gun chamber and the substrate chamber. The gun has 2 cathode and 2 neutralizer tungsten filaments each having their own power supplies. Ion current densities are measured with a probe that can be moved across the beam via a differentially pumped sliding vacuum feedthrough. A Meissner liquid nitrogen cold trap is mounted between the stage and the gun to condense any extra chlorine and reaction products. Ion beam bake outs to warm the cold trap and the internal walls of the vacuum vessel are performed to remove water from the system. To alleviate any delay, a load lock is added which eliminates the need to open the chamber door for installing parts onto the stage.

Serving as the mask material, a single layer of positive photoresist is applied to the top surface of the MBE material. Such material is exposed on a Karl Suss MJB3 contact mask aligner. The mask material is Hoechst Celanese® type AZ5200 series positive photoresist. In order to determine etch depth, a drop of positive photoresist is initially soft baked at 90° C. for 30 minutes onto a sample of the substrate surface to observe what effects the ion beam and the chlorine has on the photoresist and to create a step whose height is measured with a stylus type profilometer model. Soft baking of the mask is done at 90° C. and the exposed photoresist developed in AZ400K diluted 1:4 at 21° C. After development, the photoresist is deep UV exposed at 254 nm at 21.6 J-cm$^{-2}$ energy density and hard baked at 120° C.

In operation, chlorine is initially delivered to the substrate containing the hard baked, UV exposed photoresist with two gas jets that are in close proximity to the substrate. The substrates are secured to a 2 inch silicon wafer with param-ethylacrilate and then glued to the stage with thermally conductive high vacuum compatible paste. MBE layers are measured and photographed in the SEM prior to and after CAIBE to determine the amount of etching that occurred. Reference MBE and GaAs materials are etched to determine equi-rate etching. Eventually a grid pattern mask consisting of 40 micro ridges is used to calibrate for etch rate and uniformity, mask erosion, selectivity, sidewall surface finish and verticality. Substrate rotation is used to improve etch quality and uniformity.

Figure 5A:
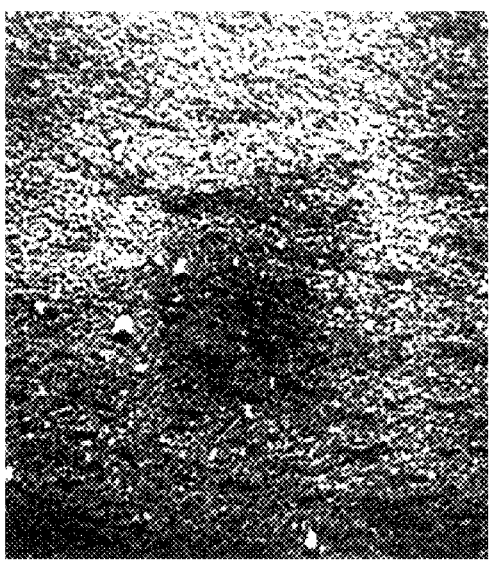
Figure 5B:
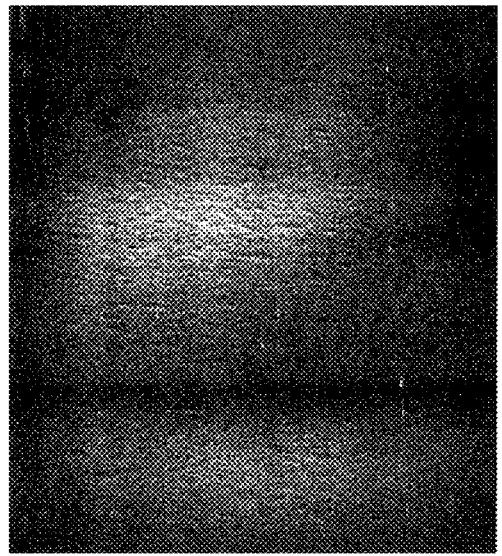

For etching MBE-grown material, the etch rate and quality is found to be highly dependent on residual gas background. As shown by an SEM photograph in FIG. 5B, the etched surface is relatively rough when the oxygen-containing species is removed down to only $10^{-9}$ Torr. As shown by a comparable SEM photograph in FIG. 5A, the etch surface is surprisingly smooth when the oxygen-containing species in the vacuum chamber is removed to less than $10^{-9}$, i.e., $10^{-11}$.

The substrate prepared by the CAIBE method in the low oxygen atmosphere, i.e., $10^{-11}$ Torr, has a vertical sidewall of 90°±5° with essentially no trenching and such sidewalls have a roughness of less than 10 nanometers, as determined by an atomic force microscopic measurement in a field view area of 10 micron×10 micron.

The foregoing description of the embodiments of the present invention has been presented for purposes of illustration and description. It is not intended to be exhaustive or to limit the invention to the precise forms described. Many modifications and variations are possible considering the above teaching. The following claims define the scope of the invention.

The invention claimed is:

1. A method for etching a substrate comprising:
defining a mask comprising a photoresist stabilized with ultraviolet light at relative humidities greater than 50% on a surface of a substrate containing at least a first layer of a first material and a second layer of a second material;
anisotropically etching said substrate through said mask in an oxygen atmosphere of less than $10^{-9}$ Torr to produce a structure in said substrate having a (1) bottom surface comprising said first material and (2) a mirrored sidewall surface comprising said first material and said second material.

2. The method of claim 1 wherein said first material or said second material comprises a semiconductor component comprising III-V material.

3. The method of claim 2 wherein said etching occurs under conditions including an energy of less than 500 e.V.

4. The method of claim 3 wherein said sidewall surface has a roughness of less than 20 nanometers.

5. The method of claim 4 wherein an etch selectivity between said first material and said photoresist is greater than 15 to 1.

6. A method for etching a semiconductor comprising:
defining a mask comprising a photoresist stabilized with ultraviolet light at relative humidities greater than 50% on a surface of a body comprising a first compound semiconductor; and
anisotropically etching said semiconductor through said mask under conditions including and energy of less than about 500 eV. in an atmosphere containing oxygen in less than $10^{-10}$ Torr to produce a structure in said body having a bottom surface and a sidewall surface comprising said sidewall surface having a roughness less than 10 nm.

7. The method of claim 6 wherein said photoresist comprises a positive photoresist.

8. The method of claim 6 wherein said photoresist having a coating thickness of greater than about 1.1 microns at 4000 rpm spin.

9. The method of claim 6 wherein said side surface comprises a mirrored facet of at least about 5 microns.

10. The method of claim 6 wherein said body comprising at least one layer of said first semiconductor compound grown by molecular beam epitaxy (MBE).

11. The method of claim 6 wherein said sidewall comprising a plurality of layers, at least some of which comprise semiconductor layers epitaxial with said body.

12. The method of claim 6 wherein said first compound semiconductor comprises a III-V material.

13. The method of claim 12 wherein said III-V material comprises one or more Group III elements selected from the group consisting of In, Al and Ga and one or more Group V elements selected from the group consisting of Sb, P, N and As.

14. The method of claim 6 wherein said III-V material selected from the group consisting of GaAs and AlGaAs.

15. The method of claim 6 wherein said etching comprises impinging said body with a mixture comprising chlorine and an inert gas.

16. The method of claim 6 wherein said etching comprises impinging said body with an ion beam.

17. The method of claim 6 wherein said etching comprises impinging said body with a mixture comprising chlorine and xenon.

18. The method of claim 6 wherein an etch selectivity between said first semiconductor compound and said photoresist is greater than about 15 to 1.

19. A method for fabricating mirrored vertical facets on semiconductor material comprising molecular beam epitaxial grown multilayers containing III-V materials, said method comprising:
cleaning said semiconductor material;
depositing a photoresist on said semiconductor material;
curing said photoresist on said semiconductor material to a thickness in the range from about 1.0 to about 1.2 micron;
exposing at least a first portion of said photoresist to ultraviolet light through at least one aperture in a mask covering said semiconductor material at relative humidities greater than 50%;
removing from said semiconductor material said first portion of said photoresist exposed to said ultraviolet light;
exposing a second portion of said photoresist to ultraviolet light to produce a stabilized second portion of said photoresist;
hard baking said second portion of said photoresist;
etching said second portion of said photoresist and said semiconductor material to produce a structure in said semiconductor material having a bottom surface and a mirrored sidewall surface, said etching comprising impinging said photoresist and said semiconductor with an ion beam having an energy less than about 1000 eV in an atmosphere containing oxygen at less than about $10^{-10}$ Torr, said ion beam comprising chlorine flowing at a rate from about 2 to about 20 sccm; and
removing a remaining portion of said photoresist.

20. The method of claim 19 wherein said energy of said ion beam is less than 500 eV.

21. The method of claim 19 wherein said semiconductor material comprises a III-V material.

22. The method of claim 19 wherein said III-V material comprises one or more Group III elements selected from the group consisting of In, Al and Ga and one or more Group V elements selected from the group consisting of Sb, P, N and As.

23. The method of claim 19 wherein said III-V material selected from the group consisting of GaAs and AlGaAs.

24. The method of claim 19 wherein said ion beam comprises a mixture comprising chlorine and xenon.

25. The method of claim 19 wherein an etch selectivity between said first semiconductor compound and said photoresist is greater than about 20 to 1.

26. The method of claim 19 wherein said semiconductor material comprising at least one layer of first semiconductor compound grown by molecular beam epitaxy (MBE).

27. The method of claim 19 further comprising forming on said semiconductor material a vertical structure comprising a plurality of layers, at least some of which comprise semiconductor layers epitaxial with said semiconductor, prior to said defining of said mask on said surface of said semiconductor material.

28. The method of claim 19 wherein said photoresist having a coating thickness of greater than about 1.3 microns at 4000 rpm spin.

29. The method of claim 19 wherein said side surface comprises a mirrored facet of at least about 5 microns.

* * * * *